(12) United States Patent  (10) Patent No.: US 7,009,880 B1
Liu  (45) Date of Patent: Mar. 7, 2006

(54) NON-VOLATILE MEMORY ARCHITECTURE TO IMPROVE READ PERFORMANCE

(75) Inventor: Ker-Ching Liu, Palo Alto, CA (US)

(73) Assignee: Programmable Microelectronics Corporation, San Jose, CA (US)

(*) Notice: Subject to any disclaimer, the term of this patent is extended or adjusted under 35 U.S.C. 154(b) by 0 days.

(21) Appl. No.: 10/921,042

(22) Filed: Aug. 17, 2004

(51) Int. Cl.
*G11C 16/00* (2006.01)

(52) U.S. Cl. .................... 365/185.11; 365/189.02; 365/230.03

(58) Field of Classification Search ............... None
See application file for complete search history.

(56) References Cited

U.S. PATENT DOCUMENTS

| | | | | |
|---|---|---|---|---|
| 5,428,574 A | * | 6/1995 | Kuo et al. ................ | 365/201 |
| 5,438,546 A | * | 8/1995 | Ishac et al. ................ | 365/200 |
| 5,519,655 A | * | 5/1996 | Greenberg ............. | 365/189.02 |
| 5,570,316 A | * | 10/1996 | Lysinger .................. | 365/196 |
| 5,572,477 A | * | 11/1996 | Jung ........................ | 365/221 |
| 5,715,193 A | * | 2/1998 | Norman .................. | 365/185.02 |
| 5,748,536 A | | 5/1998 | Kwon et al. | |
| 6,327,184 B1 | | 12/2001 | Micheloni et al. | |
| 6,674,668 B1 | | 1/2004 | Ikehashi et al. | |

* cited by examiner

*Primary Examiner*—Tan T. Nguyen
(74) *Attorney, Agent, or Firm*—MacPherson Kwok Chen & Heid LLP; Tom Chen

(57) ABSTRACT

A memory cell array is physically divided into an even number of sectors, with each pair of sectors sharing read circuitry. The outputs of the shared read circuitry are commonly connected to form data lines spanning the height of the array, which are input to global sense amplifiers. A two-stage sensing scheme is employed, with first stage and global sense amplifiers. The driving capability of the first stage sense amplifier can be used to decrease the time to charge or discharge the data lines, which reduces the total signal development time and consequently improves read performance. Granularity of the array can be adjusted by dividing groups and sub-groups of memory cells within a sector accordingly. In a read operation, the bit line in the opposite sector at the same column location is used as reference bit line, which greatly improves matching of bit line loading for the sensing.

22 Claims, 2 Drawing Sheets

NON-VOLATILE MEMORY ARCHITECTURE TO IMPROVE READ PERFORMANCE

BACKGROUND

1. Field of the Invention

The present invention relates generally to semiconductor memory devices, and more particularly to read architectures for non-volatile memories.

2. Related Art

Non-volatile semiconductor memories and arrays are widely used to store written or programmed information or data. The information or data, represented as a "1" or "0", is stored in individual memory cells, such as EEPROMs, EPROMs, NOR-type flash memory cells, or NAND cells. An array of such individual memory cells are interconnected by columns of bit lines and rows of word lines. Associated bit-line and word-line decoders allow specific memory cells to be accessed or read, erased, and programmed by applying appropriate voltages to selected bit lines and word lines. In a typical read operation, a read circuit senses the threshold voltage of a floating gate transistor in a memory cell to determine the value or data stored in the cell. The sensing can be with a conventional sense amplifier that compares the voltage or corresponding current from the memory cell with a reference voltage or current. This comparison, as is known in the art, allows the content stored in the accessed memory cell to be read out.

FIG. 1 shows portions of a conventional memory array 100, which includes N sectors 102, with each sector partitioned into M groups 113 of L memory cells in a row. Each column of groups 113 shares a global bit line 104, a reference global bit line 106, a bit line multiplexer 108, a dummy bit line multiplexer 110, and a sense amplifier 112. Within each sector, there are M*L sub-bit lines 114 and M reference sub-bit lines 107. Many elements are not shown for clarity, such as memory cells within each sector 102, word lines along the x-direction, and word line and bit line decoders. Note also that dummy bit line multiplexers 110 are typically located away from bit line multiplexers 108, as will be discussed below. Within each sector, memory cells are arranged in rows and columns, with each group 113 of L memory cells along a row having L global bit lines 104 and one reference global bit line 106.

For example, for an array having K=4096 memory cells across and the memory cells within each sector partitioned in groups of L=512 memory cells, there are M=K/L=8 reference global bit lines 106. Each partitioned group 113 within a sector is also associated with one bit line multiplexer 108, one dummy bit line multiplexer 110, and one sense amplifier 112. The bit-line multiplexers are L:1 multiplexers, and the dummy bit line multiplexers are similar in structure to the bit line multiplexers, as will be discussed below. The output signal from the bit line multiplexer (representing the value stored in the selected memory cell) and the output signal from the dummy bit line multiplexer (representing a reference signal) are input to the sense amplifier. The sense amplifier compares the two input signals and generates a signal representing the data stored in the selected memory cell.

Each row of memory cells in a sector 102 is associated with one word line. Each column of memory cells in a sector 102 is associated with one sub-bit line 114 that spans only the height of the sector, where the sub-bit line is connected to a source (or drain) of each memory cell in the column. One global bit line 104 that spans the entire height of the N sectors 102 is coupled to each of the N sub-bit lines 114 along a column in the array by a switch or select transistor (not shown). When a desired memory cell is to be read, the appropriate voltages are applied to a corresponding word line and select line, which charges or discharges the attached sub-bit line depending on the type of memory cell and data stored in the cell. The sub-bit line associated with the selected memory cell is electrically coupled to its corresponding global bit line via the switch or select transistor. This global bit line is then selected by the L:1 bit line multiplexer for use by the sense amplifier. During the read operation, only one sector is being selected at a time. Sub-bit lines in unselected sectors are electrically isolated from the main bit line with their select transistors being turned off. Such an arrangement and scheme is known and is commonly referred to as a divided bit line scheme or architecture.

Divided bit line schemes are used to improve read performance or reduce read times, which can become increasingly long with ever-increasing array sizes. During a read operation, the selected bit-line is charged or discharged by the cell current to a pre-defined level, as is known in the art. The time needed to charge or discharge is proportional to the total parasitic capacitance associated with the bit-line. Thus, as memory arrays become larger, the bit-lines become longer and the bit line multiplexers become wider, resulting in larger parasitic capacitances. This in turn increases signal development time.

The value of the total capacitance that is to be charged or discharged by cell current during a read operation can be expressed as follows:

$$C_{total} = C_{DL} + C_{BLM} + C_{GBL} + C_{SBL} \quad (1)$$

where $C_{total}$ is the total capacitance, $C_{DL}$ is the data line capacitance, $C_{BLM}$ is the bit line multiplexer capacitance, $C_{GBL}$ is the global bit line capacitance, and $C_{SBL}$ is the sub-bit line capacitance. Both $C_{DL}$ and $C_{BLM}$ are proportional to the width of the bit line multiplexer. $C_{SBL}$ is linearly proportional to the length of the sub-bit line or the number of cells on the sub-bit line. Thus, by dividing the bit lines into smaller sub-bit lines, the total bit-line capacitance is reduced and read times are improved. The signal development time for a read operation can be given as follows:

$$t_{SD,total} = \frac{C_{total} \cdot \Delta V}{I_{cell}} = \frac{C_{DL} \cdot \Delta V}{I_{cell}} + \frac{C_{BLM} \cdot \Delta V}{I_{cell}} + \frac{C_{GBL} \cdot \Delta V}{I_{cell}} + \frac{C_{SBL} \cdot \Delta V}{I_{cell}} = \quad (2)$$

$$t_{SD,DL} + t_{SD,BLM} + t_{SD,GBL} + t_{SD,SBL},$$

where $\Delta V$ is the change of signal level needed to be developed for the sense amplifier to produce a correct output corresponding to stored data in the selected memory cell, $I_{cell}$ is the cell current, $t_{SD,DL}$ is the time it takes $I_{cell}$ to develop $\Delta V$ on the data line, $t_{SD,BLM}$ is the time it takes $I_{cell}$ to develop $\Delta V$ on the capacitance associated with the bit line multiplexer, $t_{SD,GBL}$ is the time it takes $I_{cell}$ to develop $\Delta V$ on the global bit line, and $t_{SD,SBL}$ is the time it takes $I_{cell}$ to develop $\Delta V$ on the sub-bit line. As $C_{SBL}$ decreases, $C_{total}$ decreases (see equation (1)), which decreases the total signal development time $t_{SD,total}$ (see equation (2)).

However, as the minimal feature size of the semiconductor manufacturing process continues to shrink, dimensions of the memory cell become smaller, memory of higher density becomes achievable and desirable. Higher density results in larger array size and in turn larger parasitic capacitances. At the same time, smaller memory cells usually result in smaller cell currents to charge or discharge such capacitances. Both larger capacitance and smaller cell current contribute to the increase of the sense time.

Another disadvantage with such a divided bit line scheme is that of a mismatch in capacitance loading between a regular bit line and a reference bit line. In order to accurately sense the value in a selected memory cell, the capacitance associated with the dummy bit line multiplexer (element 110 in FIG. 1) should be as closely matched to the capacitance of the bit line multiplexer (element 108 in FIG. 1) carrying the signal from the selected memory cell as possible. To that objective, the dummy bit line multiplexer will have a similar structure as the bit line multiplexer. For example, if the bit line multiplexer is a 16:1 MUX, the bit line multiplexer is formed with 16 transistors, each having one terminal connected to a global bit line, one terminal commonly connected together as the MUX output, and the gate coupled to a select signal for selecting the desired bit line for the output. The dummy bit line multiplexer would then also have 16 transistors, with one transistor connected to the reference bit line and the remaining 15 transistors turned off. This structure then has a similar capacitance to the regular bit line multiplexer.

However, because of space restrictions, dummy bit line multiplexer 110 cannot be placed adjacent or near bit line multiplexer 108 as shown in FIG. 1. In a practical layout, the dummy bit line multiplexer is located along a periphery of the array. As such, signals traveling through the dummy bit line multiplexer must propagate through longer transmission lines to reach the sense amplifier. Consequently, the mismatch of capacitance loading between the dummy bit line multiplexer and the regular bit line multiplexer is increased. This mismatch reduces the read performance of the array by increasing read time to maintain the same level of accuracy. Building a reference bit line and reference bit line multiplexer with identical layout and parasitic capacitances to those of a regular bit line and bit line multiplexer is very costly and/or greatly increases the array size to the extent that such an option is not practical.

Accordingly, there is a need for an improved read architecture and method for nonvolatile memory arrays that overcomes the disadvantages of conventional read architectures, such as described above.

SUMMARY

The present invention provides a memory array with read circuitry for improved read performance. In one embodiment, the memory array is divided into an even number of sectors, where each sector is further divided into groups of memory cells and the groups divided into sub-groups. Thus, each sub-group contains an array of memory cells, which may be nonvolatile, flash EPROM, and EEPROM, among others. Each pair of sectors shares the same read circuitry, which includes multiplexers connected to bit lines and local sense amplifiers receiving the output of the multiplexers.

Each sub-group contains L columns of memory cells and L bit lines connected to a corresponding one of the L memory cells. An L:1 multiplexer is associated with each sub-group and can select one of the L bit lines as its output. A corresponding L:1 bit line multiplexer is in the opposite sector. The output of each of the two multiplexers is input to a local sense amplifier that generates a "true" output corresponding to a sensed value and a "complement" output signal. The local sense amplifier senses data from a selected cell and amplifies the difference signal for a "first stage" sensing. Thus, each sub-group of memory cells is associated with one multiplexer and shares one local sense amplifier with a multiplexer corresponding to a sub-group in the opposite sector.

Each group within a sector contains M sub-groups, with each group sharing a global sense amplifier with a group corresponding to the opposite sector. Each group includes M local sense amplifiers, where the "true" output of the sense amplifiers are commonly connected, such as by a wired-OR connection. Similarly, the "complement" output of the sense amplifiers are commonly connected, again such as with a wired-OR connection. This wired-OR connection forms a data line DL and its complement $\overline{DL}$. DL and $\overline{DL}$ are input to a global sense amplifier that amplifies the sense signal from the local sense amplifiers to provide a "second stage" sensing. Thus, each paired group of memory cells is associated with one global sense amplifier, M local sense amplifiers, and 2M L:1 multiplexers.

The total sense time needed for a read operation is the sum of the time for a sensing current to charge or discharge the associated bit lines (local sense amplifiers) and the time for a sensing current to charge or discharge the data line (global sense amplifiers). The total sense time can be reduced, according to the present invention, by increasing the sensing current for the global sense amplifiers. This can be accomplished by increasing the size of the local sense amplifiers, which may lie along a periphery of the device. Further, the groups and sub-groups may be divided into larger or smaller groups to change the granularity of the memory array. Finer granularity of the first stage sense amplifier makes it possible to use bit line multiplexers of narrower width which in turn allows simpler single stage multiplexer design with smaller parasitic capacitance.

The present invention also provides a better matching of bit line loading. In a read operation, the bit line in the opposite sector at the same column location is used as a reference bit line. The opposite sector is not enabled for read operation. The reference bit line is selected by the corresponding multiplexer and used as a reference by the local sense amplifier for the selected bit line coupled to the memory cell to be read. Since the reference signal is received from circuitry that is the same and in the same symmetric location as the selected signal, mismatches caused by dummy elements being located away from the active elements are greatly reduced. In another aspect, the reference cell current can be generated globally, such as by a circuit along the array periphery, and mirrored from the current source into the array.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

Embodiments of the present invention and their advantages are best understood by referring to the detailed

DETAILED DESCRIPTION

According to one aspect of the present invention, a memory cell array is physically divided into an even number of sectors, with each pair of sectors having local read circuitry comprising local sense amplifiers and multiplexers. Each sector is divided into groups of memory cells, with each group further divided into sub-groups of memory cells. Each sub-group is associated with a multiplexer and a local sense amplifier, with the sense amplifier being shared with another sub-group from a corresponding sector. A global sense amplifier is associated with each group of memory cells and local sense amplifiers. The local sense amplifiers sense local data lines within the sectors, while the global sense amplifiers sense global data lines associated with each group of memory cells. Thus, a two-stage sensing scheme is employed.

The present invention also takes advantage of physical space outside the memory array. Consequently, the transistor size of local sense amplifiers can be properly designed to provide sufficient current to charge or discharge global data lines in a timely manner for the second stage sensing. This decreases the overall sensing time. Further, for each pair of sectors, the one sector not selected (i.e., the one not containing the memory cell to be read) is used as a reference for the local sense amplifiers. As a result, there is a very small mismatch, if any, for the capacitance associated with the signals to the local sense amplifiers.

Figure 1:
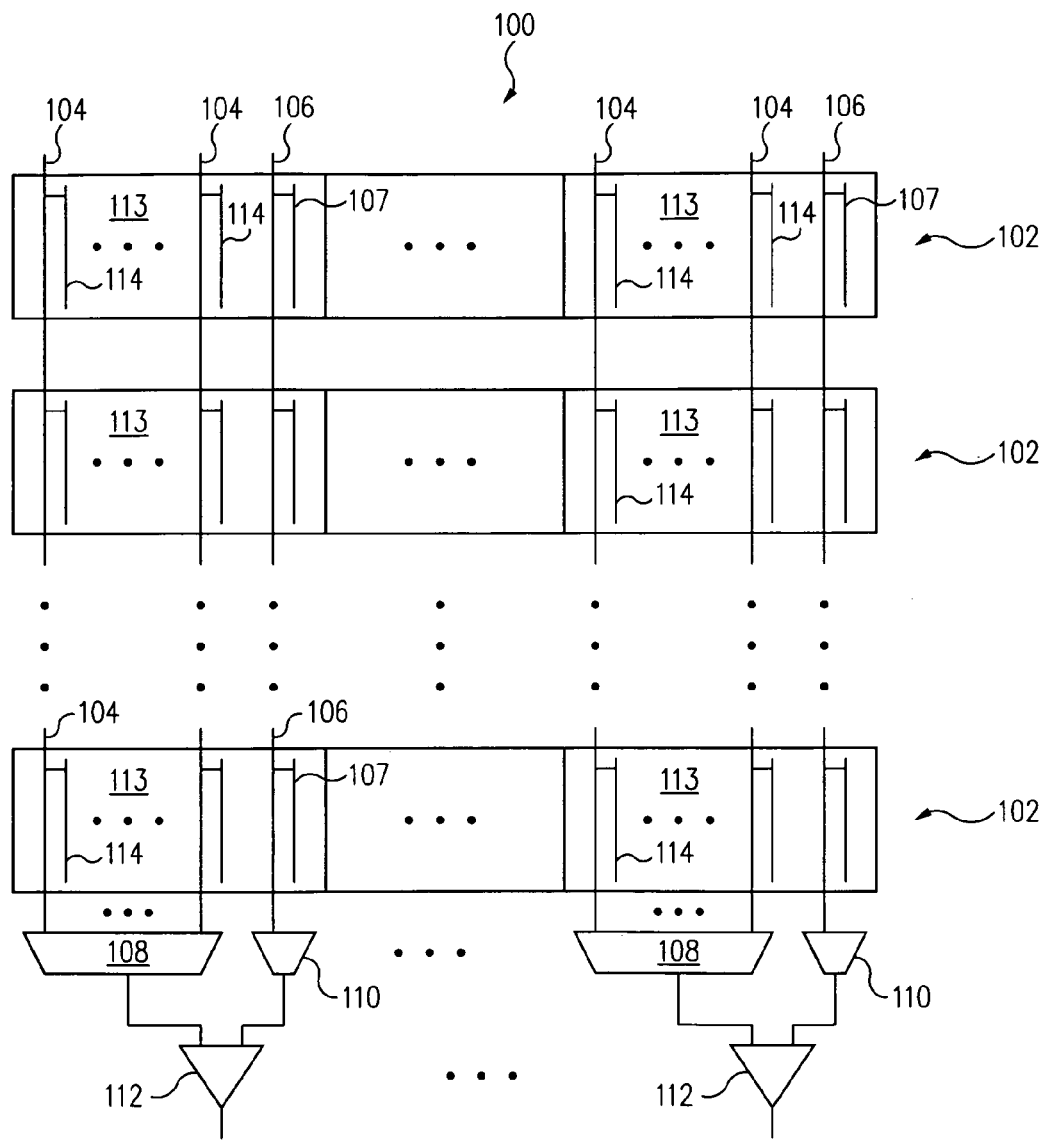
FIG. 1 is a diagram of a portion of a conventional divided bit line memory array architecture, with associated read circuitry.
Figure 2:
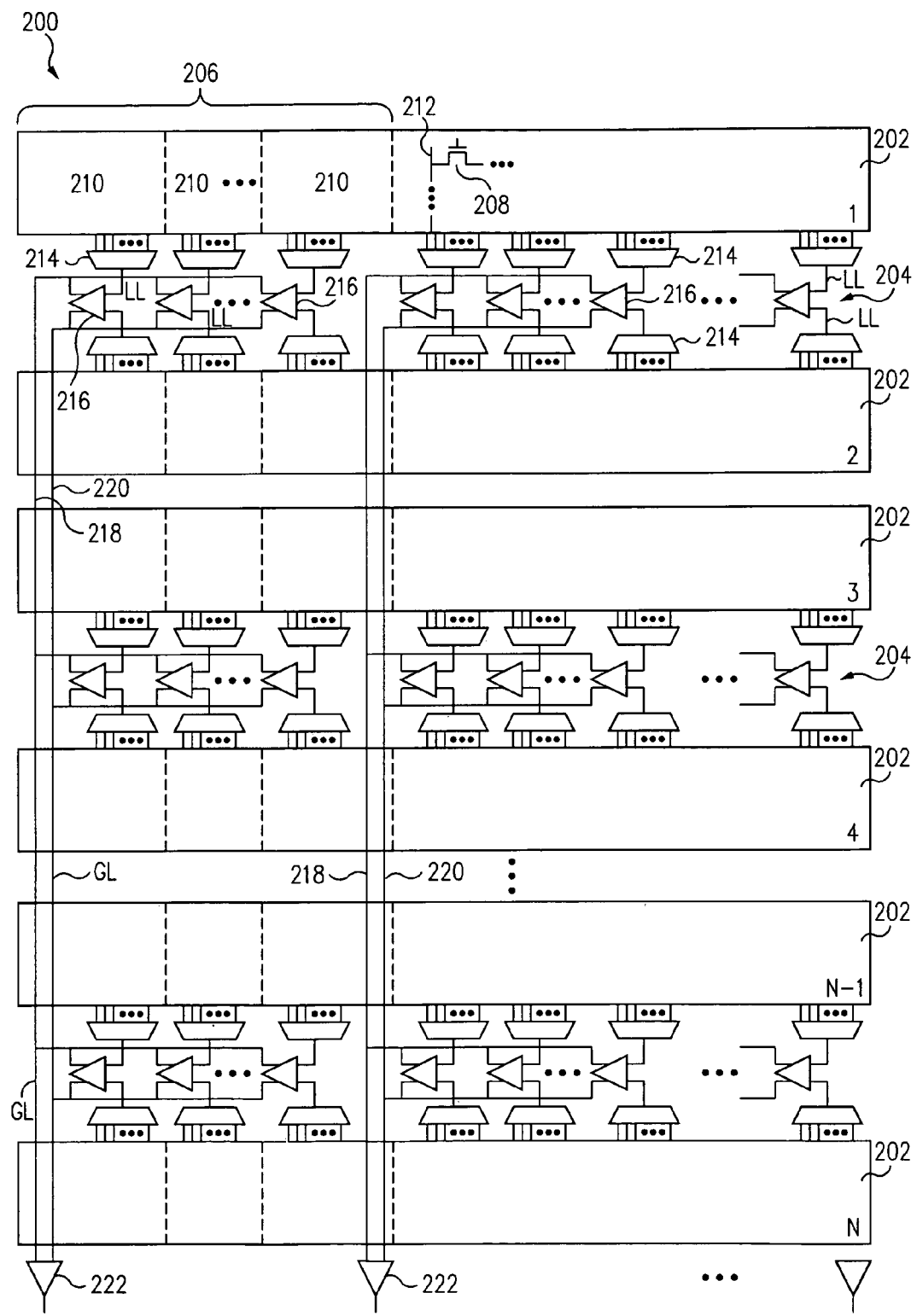
FIG. 2 is a diagram of a portion of a memory array architecture with a two-stage sensing scheme according to one embodiment of the present invention.

FIG. 2 is portion of a memory array 200 according to one embodiment of the present invention. Memory array 200 includes N sectors 202, with each pair of sectors associated with one read circuitry 204. Each sector is divided into one or more groups 206 of memory cells 208 (exaggerated in size for clarity), only one of which is shown for illustration. Each group 206 of memory cells, in turn, is divided into one or more sub-groups 210. Sectors, groups, and sub-groups contain rows and columns of memory cells. Memory cells 208 can be any type of suitable memory storage element, such as, but not limited to, nonvolatile memory cells, flash memory cells, floating gate EPROMs and EEPROMs, one or more PMOS transistors, one or more NMOS transistors, NAND circuits, and NOR circuits. A source or drain terminal of each memory cell is connected to a bit line 212. Conventional circuitry (not shown), such as word line decoders and bit line decoders, is used for selecting or unselecting the memory cell.

Each sub-group 210 of memory cells shares a single multiplexer 214. For example, if the sub-groups contain 16 memory cells 208 in a row, multiplexer 214 is a 16:1 multiplexer, with the 16 inputs to the multiplexer being the 16 bit lines associated with each of the 16 memory cells. The output of each multiplexer 214 is coupled to an input of a local sense amplifier 216 by local data lines LDL. The other input to sense amplifier 216 is the output of a corresponding multiplexer 214 from the other one of the two sectors in the pair. Each local sense amplifier 216 is thus shared by numerous memory cells for sensing their stored logic values. Local sense amplifier 216 outputs two signals, a "true" signal and a complement. Conventional sense amplifier circuits can be used, such as ones that include a differential amplifier circuit that generally senses a current (or voltage) differential between the current (or voltage) appearing on a bit line connected to the selected memory cell and on a reference line. The sense amplifier then provides a sense output signal that represents the stored logic value. Various types of sense amplifiers can be used, such as conventional differential sense amps and one described in commonly-owned U.S. patent application Ser. No. 10/390,136, entitled "Sense Amplifier Circuit and Method", filed Mar. 14, 2003 by Shiou-Yu Alex Wang et al., which is incorporated by reference in its entirety.

The "true" output of each local sense amplifier 216 in a group 206 is connected together by a wired-OR, and the complement output of each local sense amplifier 216 in the same group 206 is connected together by a wired-OR. The wired-OR connection of the true outputs forms a "true" global data line 218, and the wired-OR connection of the complement outputs forms a "complement" global data line 220. The true and complement global data lines span the entire height of the array or N sectors, with the true global data line 218 and the complement global data line 220 used to carry signals to a global sense amplifier 222, which amplifies the signal from the local sense amplifiers. Global sense amplifier 222 senses the difference between its two input signals and produces an output representative of the logic value stored in the selected memory cell. Global sense amplifier 222 can be of types similar to local sense amplifier 216 or any other suitable type of sense amplifier circuit. Thus, there is one global sense amplifier 222 for each group 206 of memory cells and one local sense amplifier 216 for each sub-group 210 of memory cells.

For example, for a 2 Meg bit sector 202 with 512 rows (or word lines) of memory cells 208, there are 4096 (2M/512) columns of memory cells and 4096 bit lines 212. Assuming each sub-group 210 of the sector has 16*512 memory cells or 16 columns and each group 206 has 32 sub-groups 210, then each sector has 8 (4096/16/32) groups 206 and 8 global sense amplifiers 222. Each group 206 has 32 pairs of 16:1 multiplexers 214 and 32 local sense amplifiers 216. Any division of sub-groups and groups within a sector can be made to increase or decrease the granularity of the sector or array. Advantages of this will be discussed below.

According to one aspect of the present invention, a two-stage sensing is performed for a read operation, with local sense amplifiers 216 doing first stage local sensing and global sense amplifiers 222 doing second stage global sensing. For example, if a particular memory cell 208 in the third sector 202 is selected to be read, various decoder circuitry turns off the unselected memory cells and the appropriate local sense amplifier 216 compares the signal from the selected bit line to the signal from a "reference" bit line. The reference bit line is from the corresponding unselected multiplexer 214 associated with the fourth (or unselected) sector 202. The global sense amplifier 222 associated with the group containing the selected memory cell then senses the difference between the signal carried on the associated global data line 218 and the complementary global data line 220.

One advantage of the present invention is that the sense time can be reduced as compared to conventional architectures. The signal development time associated with the scheme of FIG. 2 can be expressed as follows:

$$t_{SD,total} = \frac{C_{GDL} \cdot \Delta V2}{I_{SA1}} + \frac{C_{LDL} \cdot \Delta V1}{I_{cell}} + \frac{C_{BLMUX} \cdot \Delta V1}{I_{cell}} + \frac{C_{BL} \cdot \Delta V1}{I_{cell}} = \quad (3)$$

$$t_{SD,GDL} + t_{SD,LDL} + t_{SD,BLM} + t_{SD,BL}$$

where $\Delta V2$ is the change of signal level needed to be developed for the global sense amplifier to produce a correct output corresponding to the output of the active local sense amplifier, $\Delta V1$ is the change of signal level needed to be developed for the local sense amplifier to produce a correct output corresponding to the stored data of the selected memory cell, $I_{SA1}$ is the local sense amplifier drive current, $I_{cell}$ is the cell current, $t_{SD,GDL}$ is the time it takes $I_{SA1}$ to develop $\Delta V2$ on the global data line, $t_{SD,BLM}$ is the time it takes $I_{cell}$ to develop $\Delta V1$ on the capacitance associated with the bit line multiplexer, and $t_{SD,BL}$ is the time it takes $I_{cell}$ to develop $\Delta V1$ on the bit line. The signal development time for the prior art scheme, expressed in equation (2), is the sum of $t_{SD,DL}+t_{SD,BLM}+t_{SD,GBL}+t_{SD,SBL}$. The signal development time $t_{SD,SBL}$ is the same as the signal development time $t_{SD,BL}$ if the sector size is made the same in both the present invention and the prior art for comparison purposes. Therefore, the difference between the total signal development time of the present invention and the prior art scheme is with $t_{SD,GDL}$, $t_{SD,LDL}$, $t_{SD,BLM}$, $t_{SD,DL}$ and $t_{SD,GBL}$. However, the signal development time $t_{SD,GDL}$ is inversely proportional to the current $I_{SA1}$ of the local sense amplifiers 216. By increasing the size of local sense amplifiers 216, which is possible since the local sense amplifiers can be located along the periphery of the array, the drive current can be increased, resulting in a signal development time $t_{SD,GDL}$ smaller than $t_{SD,GBL}$. As shown in FIG. 2, local sense amplifiers 216 can be placed between pairs of sectors 202 along a row direction, according to one embodiment.

Thus, the current driving capability of the first stage local sense amplifier is not limited by the memory cell and can be made larger than the memory cell current to improve speed. This can also be accomplished by increasing the granularity or making the granularity finer by increasing the number of local sense amplifiers. This allows multiplexers 216 to be of narrower width, which in turn allows simpler single stage multiplexer design with smaller parasitic capacitance. Consequently $C_{BLM}$ and $t_{SD,BLM}$ also become smaller. Finer granularity also allows shorter local data lines which make $C_{LDL}$ and $t_{SD,LDL}$ smaller than $C_{DL}$ and $t_{SD,DL}$ of the prior art scheme. Smaller $t_{SD,GDL}$, $t_{SD,BLM}$, and $t_{SD,LDL}$ all contribute to the reduction of the total signal development time $t_{SD}$, and in turn improves read performance.

Another advantage of the present invention is the improvement in matching of the bit line loading as seen by local sense amplifiers 216. Local sense amplifier 216 has as one of its inputs the bit line 212 carrying the signal corresponding to the stored data from the selected memory cell. The other input is a reference bit line from a corresponding multiplexer from the unselected (or oppositely located) sector. Because the two sectors sharing circuitry 204 are the same and the multiplexers 214 associated with the bit lines are the same, with a symmetrical placement in relation to the local sense amplifiers 216, a very close match of bit line loading is possible. This reduces signal development needed by the local sense amplifier to produce a correct output and consequently improves read performance.

In one embodiment, a common reference current generation circuit coupled to the bit lines can be used to provide a reference current for the unselected bit line. For example, if a 6 $\mu$A current is generated for a selected or "on" memory cell and a 0 $\mu$A current is associated with an unselected or "off" memory cell, a reference current of 3 $\mu$A may be selected. The reference current generation circuit may be a global circuit, in which switches or select transistors determine whether or not a particular bit line is coupled to the current. In other embodiments, the reference current generation circuit may be comprised of multiple current generators located at various portions of the array. In one embodiment, the reference current generation circuit or circuits are placed along a periphery of the array, which allows more flexibility in the placement due to less space limitations than the interior of the array. Current-to-voltage converters may be used to generate an output reference voltage having a voltage level that is based upon the value of the reference current and an output cell voltage having a voltage level that corresponds to the current of the selected memory cell.

Thus, the present invention improves read performance and scalability by adding a first stage sensing circuitry for each pair of sectors, and using global sense amplifiers in a second stage to amplify the output of the first stage. This allows larger first stage drive current than the cell current by choosing proper size of the first stage sense amplifiers, and/or narrower width of multiplexers in the first stage. The larger drive current reduces the signal development time needed for the global data lines with the global sense amplifiers. Bit line matching for the reference signal is also increased since the reference signal is generated by circuitry that has the same configuration, size, and layout as the circuitry used to carry the signal for the selected memory cell to be read.

Embodiments described above illustrate but do not limit the invention. It should also be understood that numerous modifications and variations are possible in accordance with the principles of the present invention. Accordingly, the scope of the invention is defined only by the following claims.

What is claimed is:

1. A memory array, comprising:
a plurality of sectors comprising memory cells, wherein each sector is divided into groups of memory cells and each group of memory cells is divided into sub-groups of memory cells;
a plurality of bit lines coupled to the memory cells in each sub-group;
a set of first multiplexers, each adapted to receive the bit lines from a sub-group from a first sector;
a set of second multiplexers, each adapted to receive the bit lines from a sub-group from a second sector;
a set of first sense amplifiers, each adapted to receive an output from one of the set of first multiplexers and one of the set of second multiplexers, wherein the outputs of the first sense amplifiers associated with a group of memory cells are coupled together; and
a set of second sense amplifiers, each adapted to receive the coupled outputs from a group of the first sense amplifiers.

2. The array of claim 1, wherein the coupled outputs are complementary.

3. The array of claim 1, wherein the coupling is with a wired-OR connection.

4. The array of claim 1, wherein the set of first sense amplifiers are located along a periphery of the array.

5. The array of claim 1, wherein the coupled outputs span the height of the array.

6. The array of claim 1, wherein the memory cells are nonvolatile memory cells.

7. The array of claim 1, wherein the number of second sense amplifiers is equal to the number of groups of memory cells in a sector.

8. The array of claim 1, wherein the number of first sense amplifiers is equal to the number of sub-groups in a sector.

9. The array of claim 1, wherein one of the first or second sectors is used as a reference for the set of first sense amplifiers.

10. The array of claim 9, wherein the other of the first or second sectors contains the memory cell to be read.

11. A method of reading a memory cell within an array of memory cells, the array comprising a plurality of sectors of memory cells, the method comprising:
   selecting the memory cell from a first one of the sectors;
   providing a reference signal from a second one of the sectors, wherein the second one of the sectors is adjacent to the first one of the sectors;
   generating a first signal based on the value of the selected memory cell and the reference signal; and
   generating a second signal based on the first signal.

12. The method of claim 11, wherein generating the first signal comprises sensing with sense amplifiers.

13. The method of claim 12, further comprising placing the sense amplifiers along a periphery portion of the memory array.

14. The method of claim 11, further comprising dividing each sector into groups of memory cells and dividing each group of memory cells into sub-groups of memory cells.

15. The method of claim 14, further comprising coupling a bit line to each column of memory cells in a sub-group.

16. The method of claim 15, further comprising coupling a sense amplifier to each of the memory cells in a sub-group.

17. The method of claim 16, further comprising coupling a global sense amplifier to the sense amplifiers in a sub-group.

18. The method of claim 11, further comprising providing a common reference current to the second one of the sectors.

19. The method of claim 18, further comprising providing the common reference current to all of the sectors not containing the selected memory cell.

20. The method of claim 19, wherein the common reference current is generated from a global current source.

21. The method of claim 20, further comprising placing the global current source along a periphery of the array.

22. The method of claim 11, wherein the memory cell is a nonvolatile memory cell.

\* \* \* \* \*